United States Patent
Xie et al.

(10) Patent No.: US 10,388,770 B1
(45) Date of Patent: Aug. 20, 2019

(54) GATE AND SOURCE/DRAIN CONTACT STRUCTURES POSITIONED ABOVE AN ACTIVE REGION OF A TRANSISTOR DEVICE

(71) Applicant: GLOBALFOUNDRIES Inc., Grand Cayman (KY)

(72) Inventors: Ruilong Xie, Niskayuna, NY (US); Chanro Park, Clifton Park, NY (US); Christopher M. Prindle, Poughkeepsie, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/924,447

(22) Filed: Mar. 19, 2018

(51) Int. Cl.
| | | |
|---|---|---|
| H01L 29/41 | (2006.01) |
| H01L 29/66 | (2006.01) |
| H01L 29/78 | (2006.01) |
| H01L 21/768 | (2006.01) |
| H01L 29/417 | (2006.01) |

(52) U.S. Cl.
CPC .... H01L 29/66795 (2013.01); H01L 21/7682 (2013.01); H01L 21/76843 (2013.01); H01L 29/41775 (2013.01); H01L 29/41791 (2013.01); H01L 29/6653 (2013.01); H01L 29/7851 (2013.01)

(58) Field of Classification Search
CPC ......... H01L 29/66795; H01L 29/41775; H01L 29/41791; H01L 29/6653; H01L 29/7851
See application file for complete search history.

(56) References Cited

U.S. PATENT DOCUMENTS

| | | | |
|---|---|---|---|
| 6,346,438 B1 | 2/2002 | Yagishita et al. | |
| 8,723,271 B2 * | 5/2014 | Yuan | H01L 21/76224 257/386 |
| 8,921,926 B2 * | 12/2014 | Masuoka | H01L 29/66795 257/329 |
| 9,064,801 B1 | 6/2015 | Horak et al. | |
| 9,362,355 B1 * | 6/2016 | Cheng | H01L 29/66742 |
| 9,368,572 B1 * | 6/2016 | Cheng | H01L 29/7827 |
| 9,425,280 B2 * | 8/2016 | Cai | H01L 29/78 |
| 9,508,825 B1 | 11/2016 | Basker et al. | |
| 9,536,982 B1 * | 1/2017 | Cheng | H01L 29/41791 |
| 9,608,065 B1 | 3/2017 | Bergendahl et al. | |
| 9,716,158 B1 | 7/2017 | Cheng et al. | |
| 9,892,961 B1 * | 2/2018 | Cheng | H01L 21/0217 |
| 9,985,107 B2 * | 5/2018 | Cheng | H01L 23/482 |

(Continued)

*Primary Examiner* — Ida M Soward
(74) *Attorney, Agent, or Firm* — Amerson Law Firm, PLLC

(57) ABSTRACT

One illustrative IC product disclosed herein includes a transistor device including a gate structure positioned above an active region, first and second conductive source/drain structures positioned adjacent opposite sidewalls of the gate structure and an insulating material positioned laterally between the gate structure and each of the first and second conductive source/drain structures. The product also includes first and second air gaps positioned adjacent opposite sidewalls of the gate structure, a gate contact structure that is positioned entirely above the active region and conductively coupled to the gate structure and a source/drain contact structure that is positioned entirely above the active region and conductively coupled to at least one of the first and second conductive source/drain structures.

18 Claims, 13 Drawing Sheets

(56) References Cited

U.S. PATENT DOCUMENTS

| | | | |
|---|---|---|---|
| 10,020,400 B2* | 7/2018 | Cheng | H01L 29/4991 |
| 10,043,801 B2* | 8/2018 | Bergendahl | H01L 27/0886 |
| 10,056,468 B2* | 8/2018 | Samavedan | H01L 29/66545 |
| 10,115,629 B2* | 10/2018 | Cheng | H01L 21/0217 |
| 10,128,334 B1* | 11/2018 | Bourjot | H01L 29/0653 |
| 10,164,041 B1* | 12/2018 | Xie | H01L 27/0886 |
| 10,211,100 B2* | 2/2019 | Xie | H01L 21/76879 |
| 10,249,728 B2* | 4/2019 | Chanemougame | H01L 29/4991 |
| 2001/0019131 A1 | 9/2001 | Kato et al. | |
| 2004/0099957 A1 | 5/2004 | Jin | |
| 2004/0140486 A1 | 7/2004 | Lee et al. | |
| 2010/0136762 A1 | 6/2010 | Beyer et al. | |
| 2012/0104512 A1 | 5/2012 | Horak et al. | |
| 2013/0015510 A1 | 1/2013 | Yan et al. | |
| 2013/0075821 A1 | 3/2013 | Baars et al. | |
| 2013/0288438 A1 | 10/2013 | Jensen et al. | |
| 2014/0110798 A1 | 4/2014 | Cai et al. | |
| 2014/0273385 A1 | 9/2014 | Liang et al. | |
| 2015/0236106 A1 | 8/2015 | Zaleski et al. | |
| 2015/0243747 A1 | 8/2015 | Kittl et al. | |
| 2015/0279972 A1 | 10/2015 | Xie et al. | |
| 2015/0340457 A1 | 11/2015 | Xie et al. | |
| 2016/0027888 A1 | 1/2016 | Ekbote et al. | |
| 2016/0049482 A1 | 2/2016 | Liu | |
| 2016/0099342 A1 | 4/2016 | Basker et al. | |
| 2016/0141207 A1 | 5/2016 | Hung et al. | |
| 2016/0365426 A1 | 12/2016 | Ching et al. | |
| 2017/0047254 A1 | 2/2017 | Fan et al. | |
| 2017/0077258 A1* | 3/2017 | Cheng | H01L 21/76831 |
| 2017/0141215 A1 | 5/2017 | Ching et al. | |
| 2017/0294537 A1* | 10/2017 | Cheng | H01L 29/7827 |
| 2017/0323824 A1* | 11/2017 | Chang | H01L 21/7682 |
| 2018/0122919 A1 | 5/2018 | Park et al. | |
| 2018/0138279 A1* | 5/2018 | Xie | H01L 29/41775 |
| 2018/0190796 A1* | 7/2018 | Ching | H01L 29/6656 |
| 2018/0204927 A1* | 7/2018 | Chanemougame et al. | H01L 29/4991 |

* cited by examiner

GATE AND SOURCE/DRAIN CONTACT STRUCTURES POSITIONED ABOVE AN ACTIVE REGION OF A TRANSISTOR DEVICE

BACKGROUND OF THE INVENTION

1. Field of the Invention

The present disclosure generally relates to the fabrication of integrated circuits, and, more particularly, to various embodiments of gate and source/drain contact structures positioned above an active region of a transistor device.

2. Description of the Related Art

Typically, due to the large number of semiconductor devices (i.e., circuit elements such as transistors, resistors, capacitors, etc.) and the required complex layout of modern integrated circuits, the electrical connections or "wiring arrangement" for the individual semiconductor devices, e.g., transistors, capacitors, etc., cannot be established within the same device level on which the semiconductor devices are manufactured. Accordingly, the various electrical connections that constitute the overall wiring pattern for the IC product are formed in a metallization system that comprises a plurality of stacked "metallization layers" that are formed above the device level of the product.

In order to function properly, for a typical transistor, separate conductive electrical paths are formed for the conductive gate structure, the source region and the drain region of the transistor. Part of that process involves forming what are generally referred to as device level contacts, i.e., a plurality of so-called "CA contact" structures, for establishing electrical connection to the source/drain regions of the transistor device, and a gate contact structure, which is sometimes referred to as a "CB contact" structure, for establishing electrical connection to the gate structure of the transistor device. The CB gate contact is typically positioned vertically above isolation material that surrounds the transistor device, i.e., the CB gate contact is typically not positioned above the active region, but it may be in some advanced architectures.

The CB gate contact is typically positioned above the isolation region so as to avoid or reduce the chances of creating an electrical short between the CB gate contact and the conductive source/drain structures (e.g., trench silicide (TS) structures) formed in the source/drain regions of the transistor adjacent the gate structure of the transistor. Typically, there are also design rules that set a minimum spacing that must be maintained between the CB gate contact and the conductive source/drain structures in an attempt to prevent such electrical shorts. Unfortunately, there is an area penalty associated with the requirement that the CB gate contact only be positioned above the isolation region. Additionally, insulating material, typically in the form of at least a sidewall spacer, is positioned between the gate structure and the conductive source/drain structures located on opposite sides of the gate structure. The spacer is typically made of silicon nitride which has a relatively high k value of, e.g., about 7-8. As a result of the physical configuration of the transistor, a gate-to-contact capacitor is defined, wherein the gate electrode functions as one of the conductive plates of the capacitor, the conductive source/drain structures function as the other conductive plate of the capacitor and the spacer is positioned between the two conductive plates. This gate-to-contact capacitor is parasitic in nature in that this capacitor must charge and discharge every time the transistor device is turned on and off, all of which results in delaying the switching speed of the device.

What is needed is a method for forming the CB gate contact structure and the CA source/drain contact structures above the active region of the transistor device so as to conserve valuable plot space on an IC product, and a device structure that at least reduces the above-described undesirable effects of the gate-to-contact capacitor described above.

SUMMARY OF THE EMBODIMENTS

The following presents a simplified summary of various embodiments of the subject matter disclosed herein in order to provide a basic understanding of some aspects of the technology disclosed herein. This summary is not an exhaustive overview of the technology disclosed herein. It is not intended to identify key or critical elements of the technology disclosed herein or to delineate the scope of the subject matter disclosed herein. Its sole purpose is to present some concepts in a simplified form as a prelude to the more detailed description that is discussed later.

Generally, the present disclosure is directed to various embodiments of gate and source/drain contact structures positioned above an active region of a transistor device. In one illustrative example, an integrated circuit product disclosed herein includes a transistor device comprising a gate structure positioned above an active region formed on a semiconducting substrate, first and second conductive source/drain structures positioned adjacent opposite sidewalls of the gate structure, and insulating material positioned laterally between the gate structure and each of the first and second conductive source/drain structures. The integrated circuit product also includes first and second air gaps positioned adjacent opposite sidewalls of the gate structure, wherein each of the air gaps is positioned in the insulating material between the gate structure and the first and second conductive source/drain structures, respectively. The integrated circuit product also includes a gate contact structure that is positioned entirely above the active region and conductively coupled to the gate structure and a source/drain contact structure that is positioned entirely above the active region, wherein the source/drain contact structure is conductively coupled to at least one of the first and second conductive source/drain structures.

BRIEF DESCRIPTION OF THE DRAWINGS

The disclosure may be understood by reference to the following description taken in conjunction with the accompanying drawings, in which like reference numerals identify like elements, and in which.

Figure 1:
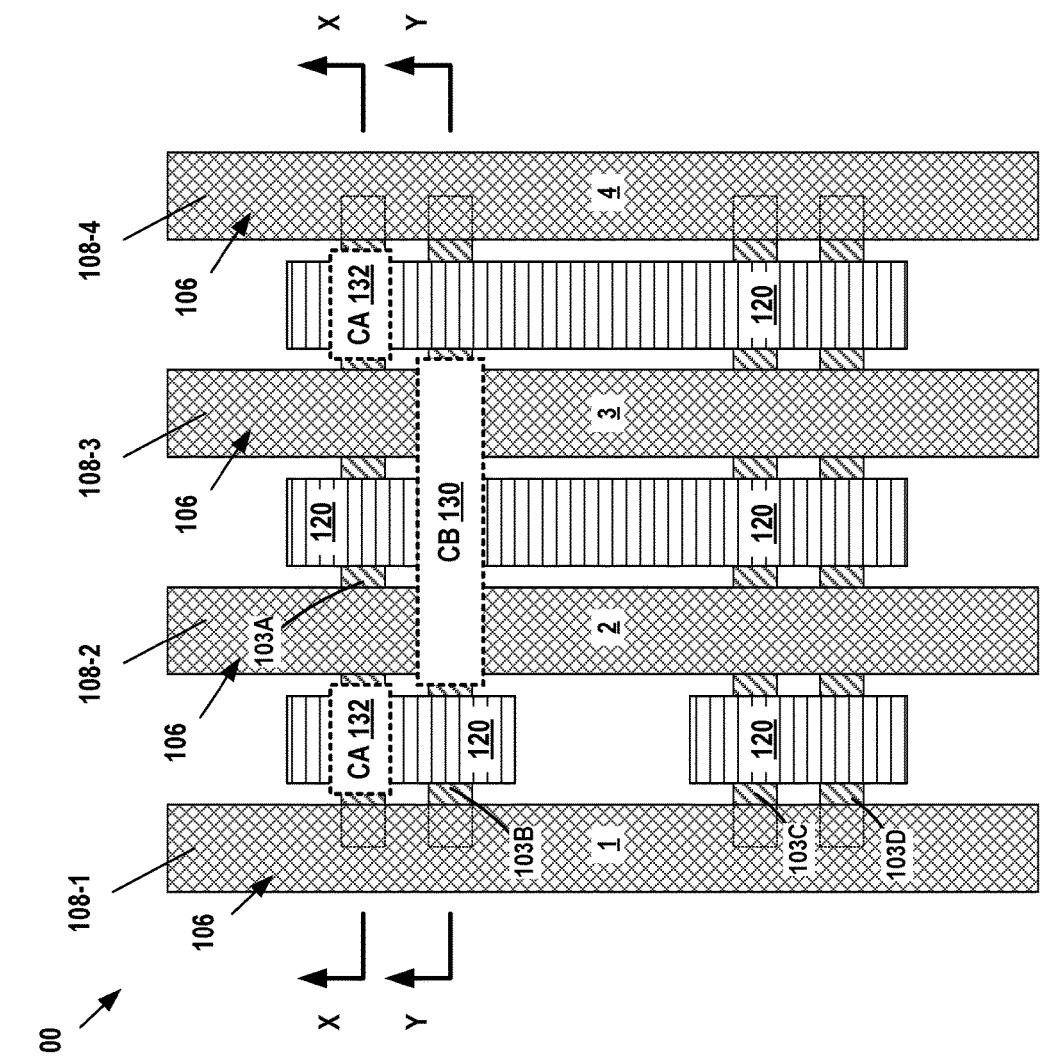
FIGS. 1-13 depict various embodiments of gate and source/drain contact structures positioned above an active region of a transistor device and various methods of making such contact structures.

While the subject matter disclosed herein is susceptible to various modifications and alternative forms, specific embodiments thereof have been shown by way of example in the drawings and are herein described in detail. It should be understood, however, that the description herein of specific and illustrative embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various embodiments of gate and source/drain contact structures positioned above an active region of a transistor device and various methods of making such contact structures. The various methods disclosed herein are described in the illustrative context of forming device level contact structures, such as source/drain contact structures and gate contact structures, on IC products. However, as will be appreciated by those skilled in the art after a complete reading of the present application, the various methods and devices disclosed herein are not limited to the formation of device level contacts. The methods and devices disclosed herein may be employed in manufacturing products using a variety of technologies, e.g., NMOS, PMOS, CMOS, etc., and they may be employed in manufacturing a variety of different devices, e.g., memory products, logic products, ASICs, etc. As will be appreciated by those skilled in the art after a complete reading of the present application, the inventions disclosed herein may be employed in forming integrated circuit products using transistor devices in a variety of different configurations, e.g., planar devices, FinFET devices, nanowire devices, etc. In the illustrative examples depicted herein, the transistor devices will be FinFET devices. The gate structures for the transistor devices may be formed using either "gate first" or "replacement gate" manufacturing techniques. Thus, the presently disclosed inventions should not be considered to be limited to any particular form of transistors or the manner in which the gate structures of the transistor devices are formed. Of course, the illustrative embodiments of the inventions disclosed herein should not be considered to be limited to the illustrative examples depicted and described herein. With reference to the attached figures, various illustrative embodiments of the methods and devices disclosed herein will now be described in more detail. The various layers of material described below may be formed by any of a variety of different known techniques, e.g., a chemical vapor deposition (CVD) process, an atomic layer deposition (ALD) process, a thermal growth process, spin-coating techniques, etc. Moreover, as used herein and in the attached claims, the word "adjacent" is to be given a broad interpretation and should be interpreted to cover situations where one feature actually contacts another feature or is in close proximity to that other feature.

FIGS. 1-13 depict various methods of forming contact structures, such as source/drain and gate contact structures, on an IC product 100. FIG. 1 is a simplistic plan view of one illustrative embodiment of an IC product 100 that may be formed using the methods described herein. Various cross-sectional views of the product 100 (views "X-X" and "Y-Y") are taken where indicated in FIG. 1. The cross-sectional views are taken in the gate length direction of the transistor devices. The entire active region will be subjected to the process described below up until the time of the actual formation of the gate contact structure 130 and the source/drain contact structures 132. Thus, only the view X-X will be depicted in FIGS. 2-9 as the view Y-Y would be the same during these portions of the process flow described below.

Figure 2:
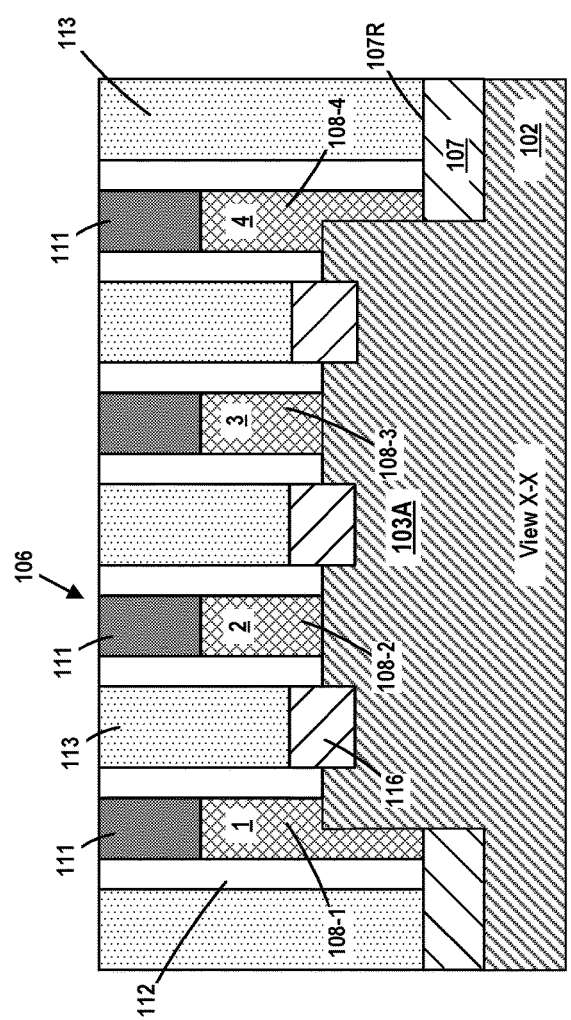

With reference to FIGS. 1-2, the product 100 generally comprises a plurality of gates 106 (see FIG. 2; numbered 1-4 for ease of reference) for various transistor devices that are formed in and above a semiconductor substrate 102. In the illustrative example depicted herein, the transistor devices are FinFET devices, but the inventions disclosed herein should not be considered to be limited to IC products that include FinFET transistor devices, as the methods disclosed herein may be used to form contact structures on a variety of different types of transistor devices. At the point of processing shown in FIGS. 1-2, a plurality of fins 103A-D (collectively referenced using the numeral 103) have been formed in the substrate 102 using traditional manufacturing techniques, and the gates 106 have been formed across the fins 103. Also depicted are illustrative conductive source/drain structures 120 (e.g., trench silicide structures) that are conductively coupled to the source/drain regions of the transistor devices.

FIG. 1 also depicts an illustrative CB gate contact structure 130 that will be formed to contact the gate structures 108-2 and 108-3 of gates 2 and 3, respectively. Of course, as will be appreciated by those skilled in the art after a complete reading of the present application, the illustrative methods disclosed herein may be employed to form a CB gate contact structure 130 that only contacts a single gate structure 108 or more than two gate structures 108. The CB gate contact structure 130 will be positioned above the active region of the transistors. As used herein, the term "active region" should be understood to be the area or "footprint" occupied by the two conductive source/drain structures 120 that are positioned on opposite sides of a gate 106 as well as the portion of gate 106 itself that is positioned between the two conductive source/drain structures 120. Also shown in FIG. 1 are a plurality of CA source/drain contact structures 132 that will be formed to contact the conductive source/drain structures 120 of the various transistor devices.

As indicated in FIG. 1, the cross-sectional view X-X is taken through the gates 106 in a gate-length direction of the transistor devices at a location where a plurality of CA source/drain contact structures 132 will be formed. In the case where the transistor devices are FinFET devices, the view X-X should be understood to be a cross-sectional view taken through the long axis of the fin 103A in a direction that corresponds to the gate length (current transport) direction of a FinFET device. The cross-sectional view Y-Y is taken through the gates 106 in a gate length direction of the transistor devices at a location where the CB gate contact structure 130 will be formed. In the case where the transistor devices are FinFET devices, the view Y-Y should be understood to be a cross-sectional view taken through the long axis of the fin 103B in a direction that corresponds to the gate length (current transport) direction of a FinFET device.

The substrate 102 may have a variety of configurations, such as the depicted bulk silicon configuration. The substrate 102 may also have a semiconductor-on-insulator (SOI) configuration that includes a bulk semiconductor layer, a buried insulation layer and an active semiconductor layer positioned on the buried insulation layer, wherein semiconductor devices are formed in and above the active layer. The substrate 102 may be made of silicon or it may be made of materials other than silicon. Thus, the terms "substrate" or "semiconductor substrate" should be understood to cover all semiconducting materials and all forms of such materials. Additionally, various doped regions, e.g., halo implant regions, well regions and the like, are not depicted in the attached drawings.

FIG. 2 depicts the IC product 100 after several process operations were performed. First, as noted above, the fins 103 were formed by performing one or more etching processes, e.g., anisotropic etching processes, through a patterned fin-formation etch mask (not shown) to form a plurality of fin-formation trenches in the substrate 102 and thereby define a plurality of fins 103. The width and height of the fins 103 may vary depending upon the particular application. Additionally, the overall size, shape and configuration of the fin-formation trenches and fins 103 may vary depending on the particular application. Next, a recessed layer of insulating material 107 (e.g., silicon dioxide) with a recessed upper surface 107R was formed between the fins 103 by performing traditional manufacturing techniques.

Still with reference to FIG. 2, after the layer of insulating material 107 was recessed, the gates 106 were formed above the fins 103. Each of the gates 106 includes a schematically depicted final gate structure 108 (numbered 108-1 to 108-4 for reference purposes), a gate cap 111 and a simplistically-depicted sidewall spacer 112. The lateral thickness (at its base) of the simplistically-depicted sidewall spacer 112 may vary depending upon the particular application. Typically, when the gate structures 108 are manufactured using known replacement gate manufacturing techniques, the materials for the gate structures 108 are sequentially formed in gate cavities between the spacers 112 after removal of a sacrificial gate electrode (not shown) and a sacrificial gate insulation layer (not shown). The gate structures 108 are typically comprised of a high-k gate insulation layer (not shown), such as hafnium oxide, a material having a dielectric constant greater than 10, etc., and one or more conductive material layers that function as the gate electrode of the gate structure 108. For example, one or more work-function adjusting metal layers and a bulk conductive material may be deposited to form the gate electrode structure.

Still referencing FIG. 2, prior to the formation of the final gate structures 108, epi semiconductor material 116 was formed on the exposed portions of the active regions (or fins 103 in the case of a FinFET device), i.e., in the source/drain regions of the devices, by performing an epitaxial growth process. The epi material 116 may be formed to any desired thickness. However, it should be understood that the epi material 116 need not be formed in all applications. Other layers of material, such as contact etch stop layers and the like, are not depicted in the drawings.

After formation of the epi semiconductor material 116, a layer of insulating material 113 (e.g., silicon dioxide) was blanket-deposited across the substrate. Thereafter a chemical mechanical polishing (CMP) process was performed to planarize the layer of insulating material 113 using the original gate caps (not shown) positioned above the sacrificial gate structures as a polish-stop layer. At that point, traditional replacement gate manufacturing processes were performed to remove the original gate caps and the sacrificial gate structures and to form the final gate structures 108 within the gate cavities defined by removing the sacrificial gate structures. Thereafter, in this particular embodiment, the materials of the final gate structures were recessed and the final gate caps 111 were formed on the product 100 by depositing gate cap material and performing a CMP process operation to planarize the upper surface of the gate caps 111 with the upper surface of the layer of insulating material 113.

Figure 3:
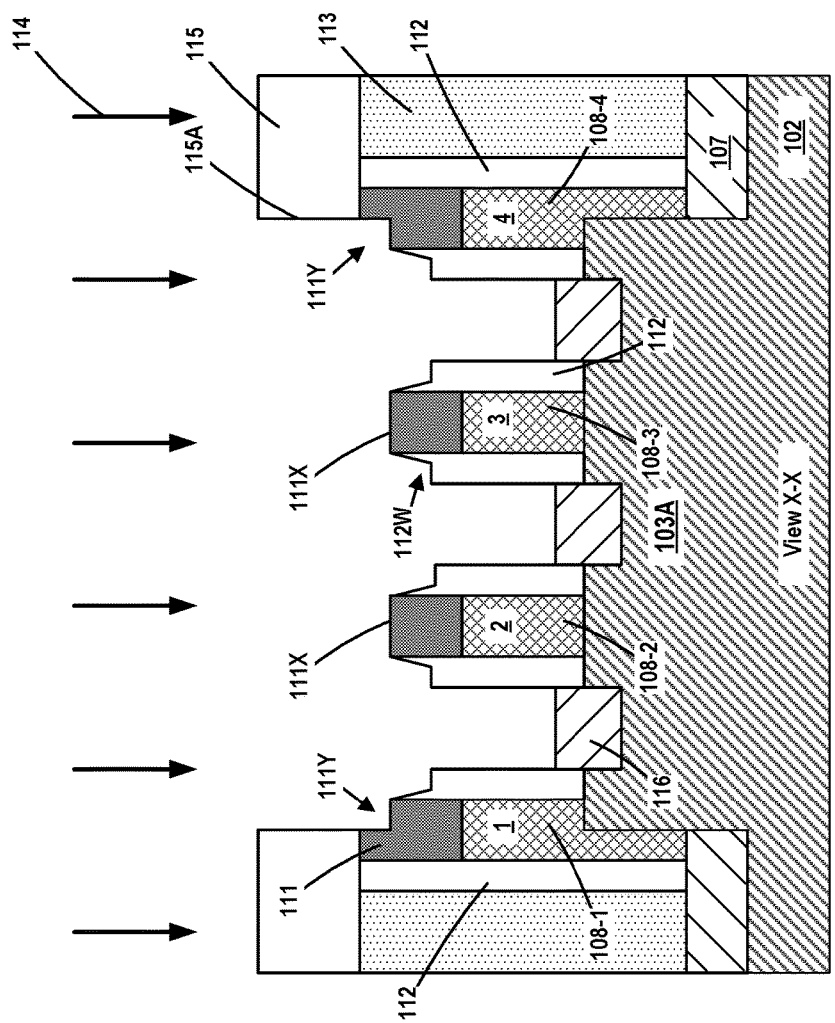

FIG. 3 depicts the IC product 100 after several process operations were performed. First, a patterned etch mask 115, e.g., a patterned OPL layer, was formed on the product 100. The patterned etch mask 115 comprises an opening 115A. The patterned etch mask 115 is representative in nature in that it may be comprised of one or more layers of materials. Then, an etching process 114 was performed on the product 100. The etching process 114 is designed to remove the portions of the layer of insulating material 113 positioned above the epi semiconductor material 116 in the source/drain regions of the transistor devices and thereby expose the source/drain regions, i.e., expose the epi semiconductor material 116 positioned between the spacers 112. However, portions of the gate caps 111, the spacers 112 and the layer of insulating material 113 are all subjected to this common etching process 114.

The materials of construction for the gate caps 111, the spacers 112 and the layer of insulating material 113 may be specifically selected so as to achieve the objectives set forth below. Of course, the materials of construction for the gate caps 111, the spacers 112 and the layer of insulating material 113 may vary depending upon the particular application. In terms of relative etch selectivity during this common etching process 114, the material of the gate caps 111 will exhibit the slowest etch rate among the three materials, while the material of the layer of insulating material 113 will exhibit the fastest etch rate among the three materials. The material of the sidewall spacers 112 will exhibit an etch rate that is intermediate the etch rate of the gate caps 111 and the etch rate of the layer of insulating material 113 when subjected to this common etching process 114. In one example, the material of the spacers 112 exhibits an etch rate that is closer to the etch rate of the layer of insulating material 113 than it is to the etch rate of the material for the gate caps 111 when subjected to this common etching process 114. In one illustrative embodiment, the layer of insulating material 113 may be comprised of silicon dioxide, the sidewall spacers 112 may be comprised of silicon carbon oxynitride (SiCON) or silicon carbon oxide (SiCO), and the gate caps 111 may be comprised of silicon nitride. Alternatively, the spacers 112 may be made of silicon nitride and the gate caps 111 may be made of silicon boron carbon nitride (SiBCN). As a result, at the completion of the common etching process 114, the layer of insulating material 113 is essentially cleared from above the epi semiconductor material 116 in the source/drain regions of the transistor devices, a portion of the upper part of the spacers 112 was removed and a portion of the thickness of the gate caps 111 was removed. More specifically, due to the selection of the appropriate materials, a notch 111Y is formed in the gate caps 111 positioned on the gates 1 and 4, i.e., in the gate caps 111 on the outermost gates (1 and 4) of the array of gates 1-4, while the gate caps 111 on gates 2 and 3 have a substantially planar upper surface 111X. A notch 112 W is also formed on the spacers 112 subjected to the etching process 114.

Figure 4:
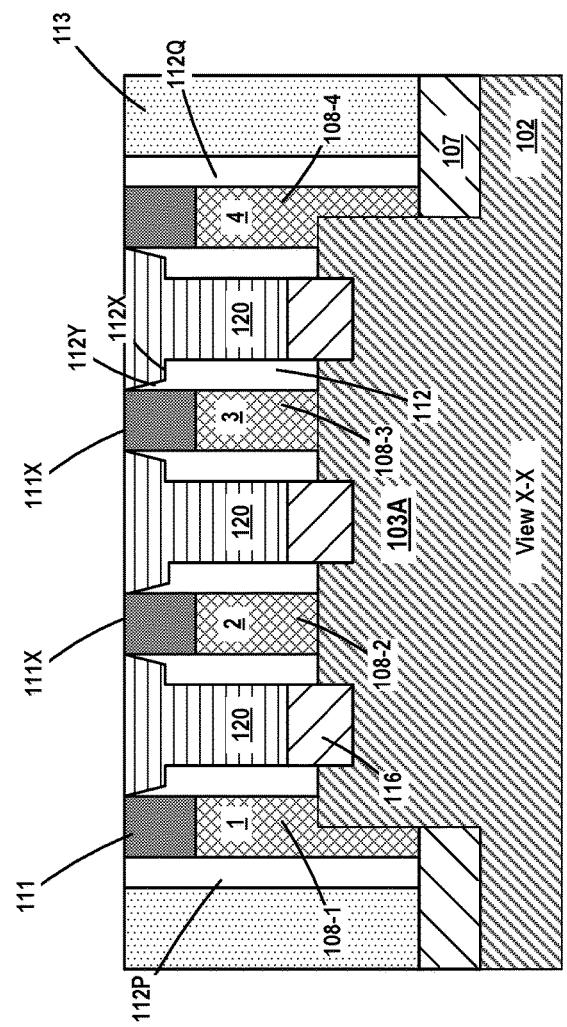

FIG. 4 depicts the IC product 100 after several process operations were performed. First, the patterned etch mask 115 was removed. Then, material for the illustrative conductive source/drain structures 120 (e.g., trench silicide structures) was formed above the product 100 so as to over-fill the spaces above the exposed epi semiconductor material 116 in the source/drain regions of the devices. At that point, one or more CMP process operations were performed to planarize the upper surface of the product with a level that approximately corresponds to the recessed upper surface 111X of the gate caps 111. These process operations result in the removal of portions of the layer of insulating material 113 and portions of the outermost spacers 112P, 112Q positioned adjacent the outside sidewall of the gate structures 108-1 and 108-4. As shown in FIG. 1, the conductive source/drain structures 120 may extend at least for substantially the entire dimension of the active region in the gate width direction of the transistor devices (into and out of the plane of the drawing page in FIG. 4) and in some cases may extend across the source/drain regions of multiple transistor devices. At this point in the process flow, the conductive source/drain structures 120 have an initial vertical height. In one illustrative embodiment, the conductive source/drain structures 120 have an axial length in the gate width direction of the transistor devices that is at least equal to a dimension of the active region in the gate width direction of the transistor device.

Figure 5:
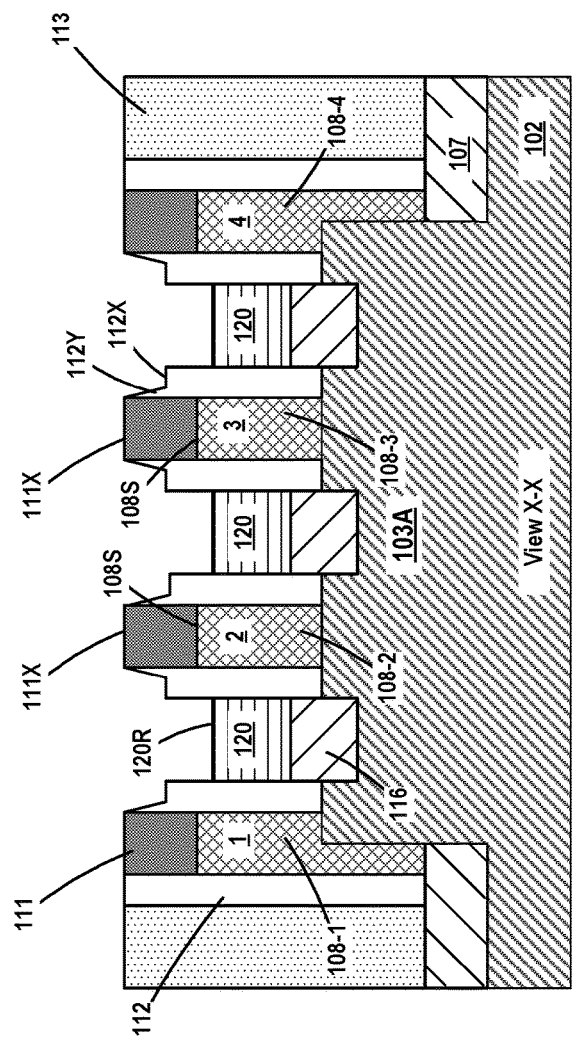

FIG. 5 depicts the IC product 100 after one or more recess etching processes were performed to recess the conductive source/drain structures 120. At the conclusion of these process operations, the conductive source/drain structures 120 have a recessed upper surface 120R and a recessed vertical height that is less than the initial height of the conductive source/drain structures 120. The recessing of the conductive source/drain structures 120 is performed so as to provide an increased vertical spacing between the recessed upper surface 120R of the conductive source/drain structures 120 and the CB gate contact structure 130 that will eventually be formed on the product 100. The amount of recessing of the conductive source/drain structures 120 may vary depending upon the particular application (e.g., 5-30 nm). At the conclusion of this recess etching process, the recessed upper surface 120R may be positioned at a level that is below (e.g., 5-30 nm) the upper surface 108S of the gate structures 108.

Figure 6:
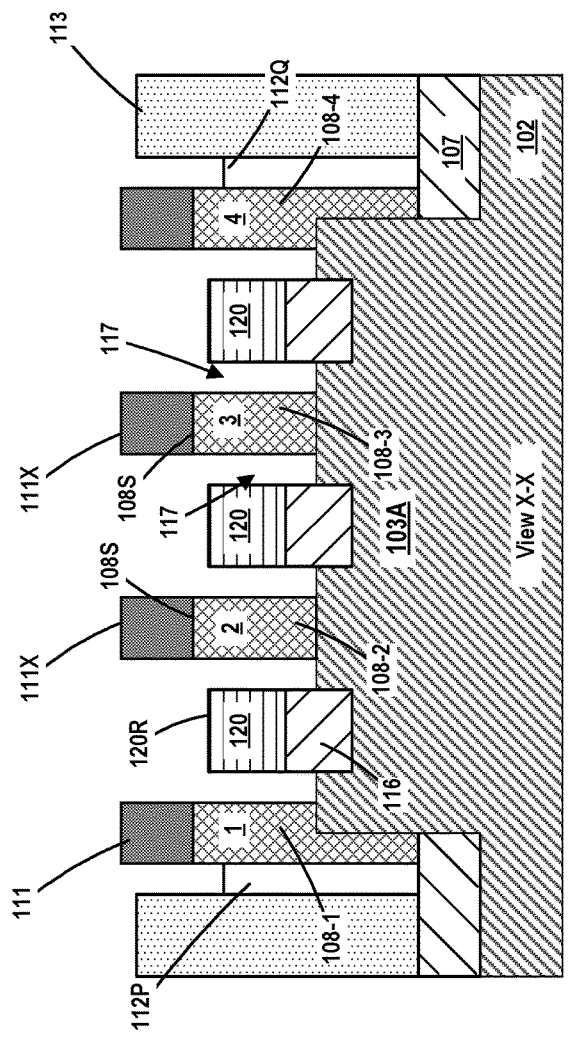

FIG. 6 depicts the product 100 after an etching process was performed to remove the spacers 112 selectively relative to the surrounding materials. This process operation results in the formation of lateral spaces 117 between the recessed conductive source/drain structures 120 and the gate structures 108. Note that, during the spacer removal process, some of the layer of insulating material 113 may be removed as well, thus FIG. 6 depicts a slight pull-down of the layer of insulating material 113. Additionally, the outermost spacers 112P, 112Q, will not be completely removed as reflected in the drawings as only the upper surface of these outermost spacers is subjected to the etching process.

Figure 7:
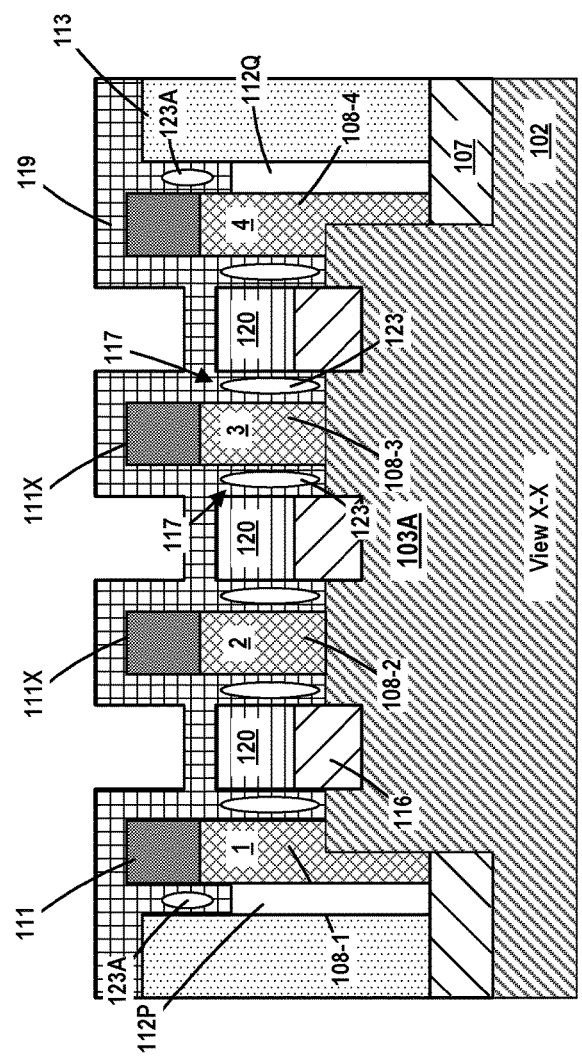

FIG. 7 depicts the product after a deposition process was performed to form a layer of spacer material 119 on the product 100. The layer of spacer material 119 may be made of a variety of different materials. In one illustrative example, the layer of spacer material 119 may be made of silicon carbon (SiC), a low-k material (k value of 7 or less), etc. The thickness of the layer of spacer material 119 may vary depending upon the particular application. Due to the relatively tight spacing 117 between the gate structures 108 and the conductive source/drain structures 120, the layer of spacer material 119 tends to "pinch off" in the spaces 117 between the gate structures 108 and the conductive source/drain structures 120. As a result, an air gap 123 is formed in the layer of spacer material positioned in the spaces 117 between the gate structures 108 and the conductive source/drain structures 120. Additionally, in some applications, relatively smaller air gaps 123A may be formed in the layer of spacer material 119 above the outermost spacers 112P and 112Q.

As depicted, the air gaps 123 are formed at least adjacent the opposite sidewalls of the gate structures 108. The size and configuration of the air gaps 123, 123A may vary depending upon the particular application. In the depicted example, the air gaps 123 are shown as having a substantially elliptical cross-sectional configuration and an overall height that is somewhat less than the vertical height of the recessed conductive source/drain structures 120. In one embodiment, this process operation results in the formation of a single continuous air gap 123 (i.e., an air gap spacer) located adjacent the sidewalls of each gate structure 108 that extends around the entire perimeter of the gate structure 108. In another illustrative embodiment, air gaps 123 may only be formed above the active regions of the product 100. In such a situation, the axial length of the air gaps 123 in the gate width direction of the transistor devices may be approximately equal to the dimension of the active region in the gate width direction of the devices. The vertical extent (or height) and the lateral width of the air gap 123 may vary depending upon the application and the manner in which the deposition process is performed to form the layer of spacer material 119. As noted above, if a replacement gate process is used to form the gate structures 108, the gate structures 108 may only be formed above the active region with an insulating material formed adjacent the ends of such gate structures 108. In that situation, the air gaps 123 might not be formed around the entire perimeter of the gate structures 108. Rather, in such a case, when looking at a single device, there would be two non-connected air gaps 123 that are formed adjacent opposite sidewalls of the gate structure 108, i.e., the air gaps 123 would not be formed around the ends of the gate structure 108 that are positioned above the isolation material 107.

Figure 8:
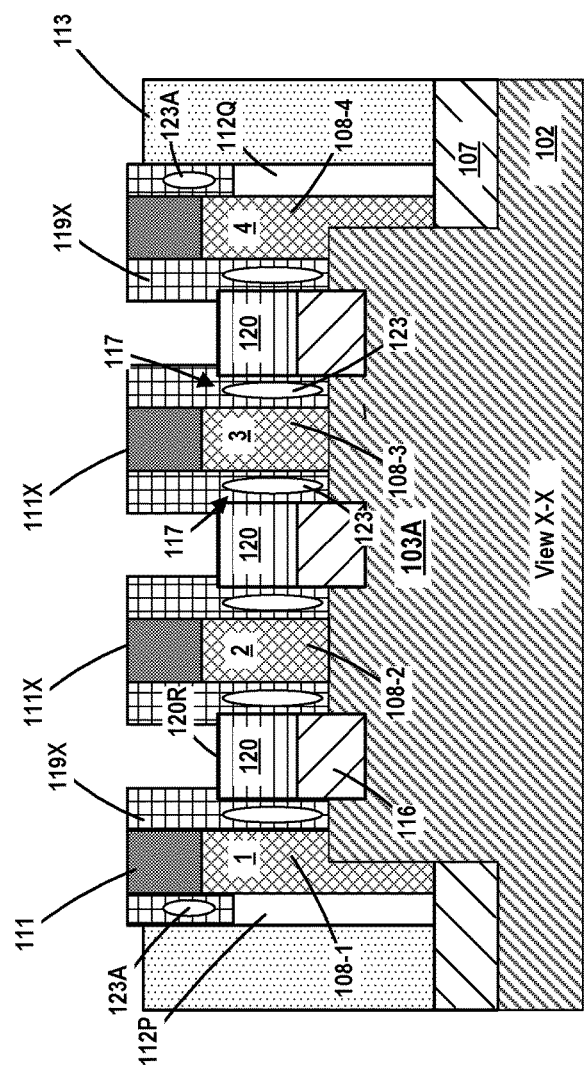

FIG. 8 depicts the product 100 after an anisotropic etching process was performed on the layer of spacer material 119 to define a plurality of spacers 119X. This process operation exposed the upper surfaces of the recessed conductive source/drain structures 120. Note that an air gap 123 on one side of the gate structure 108 is positioned in a first portion of the sidewall spacer 119X at a location between the gate structure 108 and one of the conductive source/drain structures 120, while a similar air gap 123 is positioned in a second portion (adjacent the opposite side of the gate structure 108) of the sidewall spacer 119X between the gate structure 108 and the other conductive source/drain structure 120. In general, the air gaps 123 are formed in insulating material (in whatever form) positioned in the spaces 117 between the gate structure 108 and the conductive source/ drain structures 120. The air gaps 123 have a vertical height that is less than the vertical height of the conductive source/drain structures 120.

Figure 9:
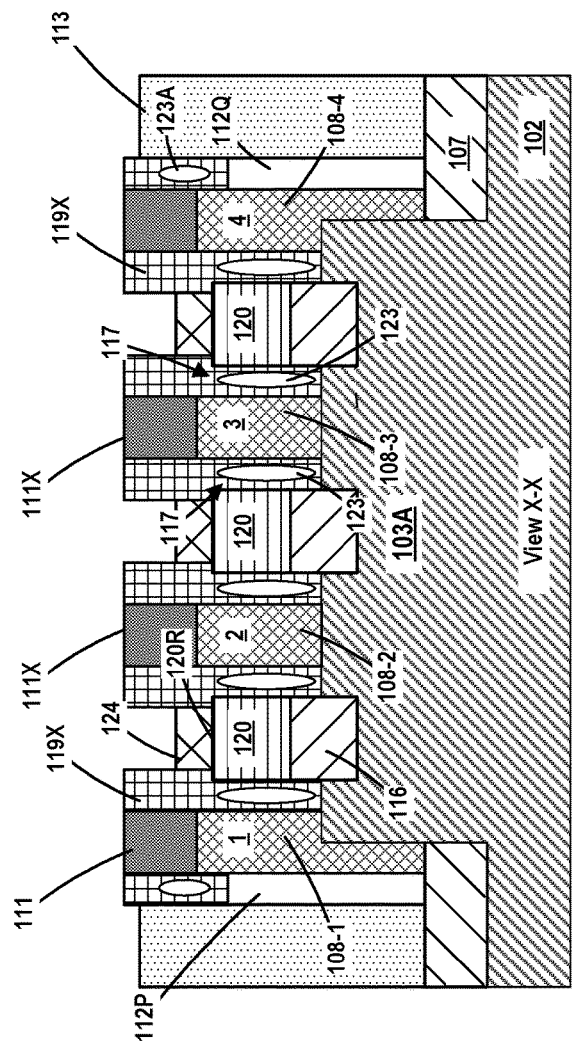

FIG. 9 depicts the product after a selective deposition process was performed to form a conductive material 124, e.g., a substantially pure metal such as cobalt, a metal alloy, etc. The amount or vertical thickness of the conductive material 124 may vary depending upon the particular application. In one illustrative example, the individual portions of the conductive material 124 may have a vertical thickness of about 5-40 nm such that the upper surfaces of the recessed portions of the layer of conductive material are positioned above the upper surfaces 120R of the recessed conductive source/drain structures 120. The conductive material 124 has a lateral width (in the gate length direction of the devices) that is less than the lateral width (in the gate length direction) of the conductive source/drain structures 120, particularly at the recessed upper surface 120R of the conductive source/drain structures 120. As depicted, in one illustrative embodiment, the air gaps 123 are only positioned between the gate structures 108 and the conductive source/drain structures 120, i.e., the air gaps are formed such that they do not extend vertically above the recessed upper surface 120R of the conductive source/drain structures 120. Stated another way, the uppermost part of the air gaps 123 is positioned at a level that is below a level of the recessed upper surfaces 120R of conductive source/drain structures 120.

Figure 10:
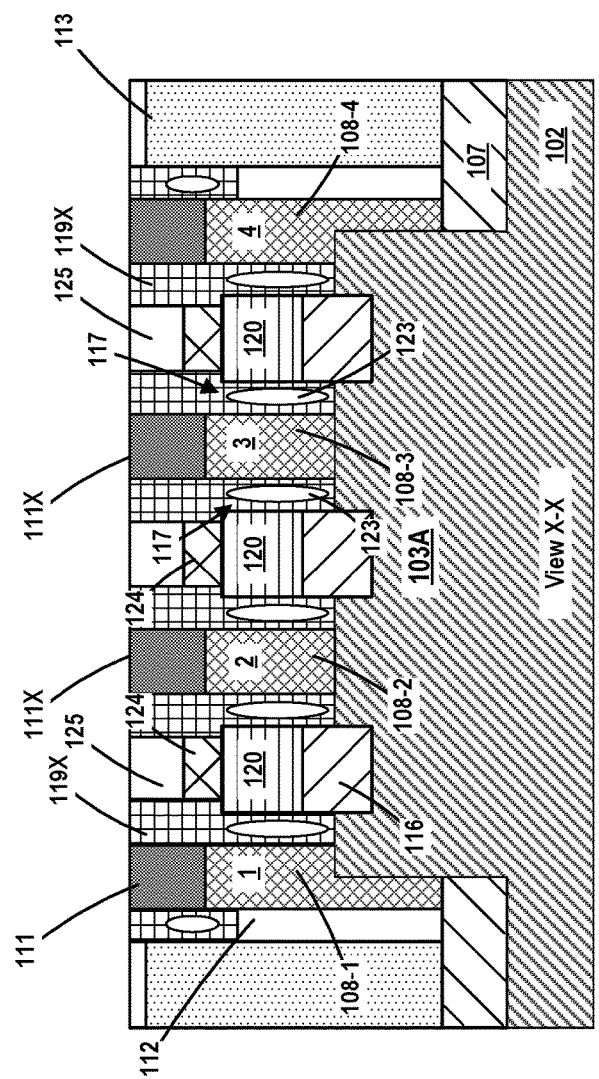

FIG. 10 depicts the product 100 after a layer of insulating material 125 was formed above the conductive material 124 and the recessed conductive source/drain structures 120, and after a CMP process was performed using the gate caps 111 as a polish-stop. An etch-back process could also be used instead of a CMP process. The layer of insulating material 125 may be comprised of a variety of different materials, e.g., silicon carbon, silicon dioxide, etc. As depicted, the layer of insulating material 125 covers the conductive materials 124 and the recessed conductive source/drain structures 120 and constitutes an insulating source/drain cap structure positioned above each of the conductive source/drain structures 120.

Figure 11:
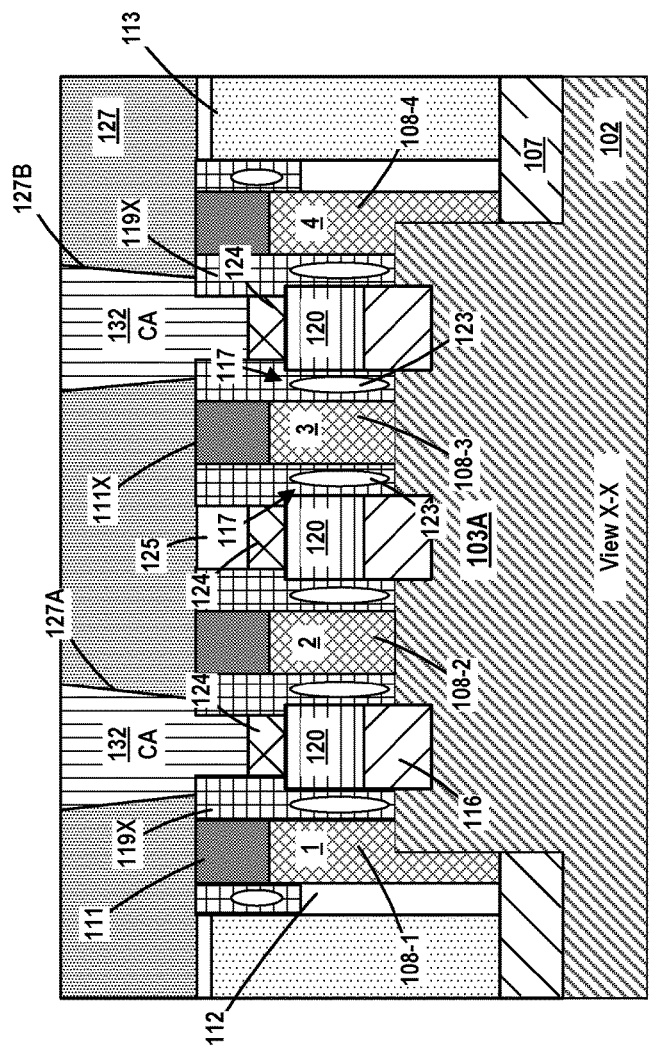
Figure 12:
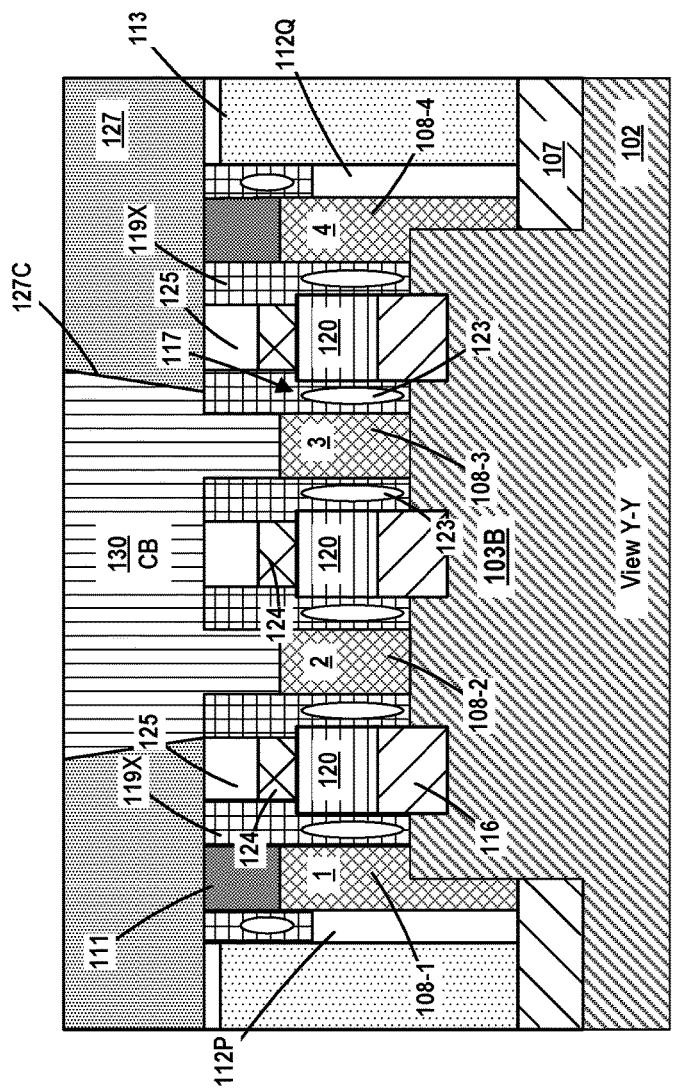

At this point, traditional manufacturing operations may be performed to form the source/drain contact structures 132 (see FIG. 11—view X-X) and the gate contact structure 130 (see FIG. 12—view Y-Y). FIGS. 11 and 12 depict the product 100 after several process operations were performed. First, additional insulating material 127, e.g., silicon dioxide, was formed above the product 100. Thereafter, in one illustrative process flow, a first patterned etch mask (not shown), e.g., a patterned OPL layer, was formed above the insulating material 127. The first patterned etch mask comprises a plurality of openings that corresponds to locations where the source/drain contact structures 132 will be formed for the product. Then, an etching process was performed through the first patterned etch mask to form the openings 127A, 127B in the insulating material 127 and the layer of insulating material 125. At the conclusion of this etching process, portions of the recessed conductive source/drain structures 120 are exposed at locations where the source/drain contact structures 132 will be formed to conductively contact the recessed conductive source/drain structures 120. In the example depicted herein, the source/drain contact structures 132 are arranged in a staggered pattern and thus only two openings 127A, 127B are shown in the view depicted in FIG. 11. Another contact opening (not shown) will be formed in the insulating material 127 for another CA contact structure (not shown) to contact the recessed conductive source/drain contact structure 120 positioned between gates 2 and 3, but that contact opening is not located in the plane of the cross-section depicted in FIG. 10. At this point in the process flow, the first patterned etch mask covers the location where the CB gate contact structure 130 will be formed (see FIG. 12). The insulating material 127 may be made of the same material as that of the insulating material 113 or it may be a different insulating material. After formation of the contact openings 127A, 127B, the first patterned etch mask was removed.

Still referencing FIGS. 11 and 12, a second patterned etch mask (not shown), e.g., a patterned OPL layer, was formed above the insulating material 127. The second patterned etch mask comprises an opening (not shown) that corresponds to the location where the CB gate contact structure 130 will be formed. The second patterned etch mask covers the CA contact openings 127A, 127B where the CA contact structures 132 will be formed. Then, an etching process was performed through the opening in the second patterned etch mask to form an opening 127C (see FIG. 12) in the insulating material 127. At the conclusion of this etching process, portions of the gate caps 111 above gates 2 and 3 as well as portions of the insulating material 125 and spacers 119X are exposed. Note that, as mentioned above, in the illustrative example depicted herein, the illustrative CB gate contact structure 130 that will be depicted herein is formed to contact both of the gate structures 108-2 and 108-3. Thereafter, one or more etching processes were performed through the opening in the second patterned etch mask to remove the exposed portions of the gate caps 111 positioned above gates 2 and 3 and thereby expose portions of the gate structures 108-2 and 108-3. Thereafter, the second patterned etch mask was removed.

With continuing reference to FIGS. 11 and 12, several process operations were performed to form the gate contact structure 130 and the source/drain contact structures 132 for the transistor devices. The gate contact structure 130 and the source/drain contact structures 132 may be comprised of a variety of different materials and they may be formed by performing various manufacturing techniques. In one illustrative example, one or more conformal barrier layers and/or seed layers (not separately shown) were formed so as to line the gate contact opening and the source/drain contact openings with the barrier material(s). Next, one or more conductive materials (e.g., copper, a metal-containing material, a metal compound, etc.) was then formed on the product 100 so as to overfill the gate contact opening and the source/drain contact openings. At that point, a CMP process was performed to remove excess portions of the conductive materials from above the upper surface of the layer of insulating material 127. These process operations result in the formation of the gate contact structure 130 and the two source/drain contact structures 132 depicted in the drawings. The gate contact structure 130 is positioned above the active region and it conductively contacts the gate structure 108-2 of gate 2 and the gate structure 108-3 of gate 3. Each of the source/drain contact structures 132 conductively contacts an underlying recessed source/drain contact structure 120. Note that, in the illustrative process flow above, the source/drain contact openings were formed before the gate contact opening was formed, but the order of formation of the gate contact opening and the source/drain contact openings may be reversed if desired.

It should be noted that, in one embodiment, portions of the gate contact structure 130 are positioned vertically above the air gaps 123 and that a portion of the source/drain contact structure 132 is positioned vertically above at least one of the air gaps 123.

Figure 13:
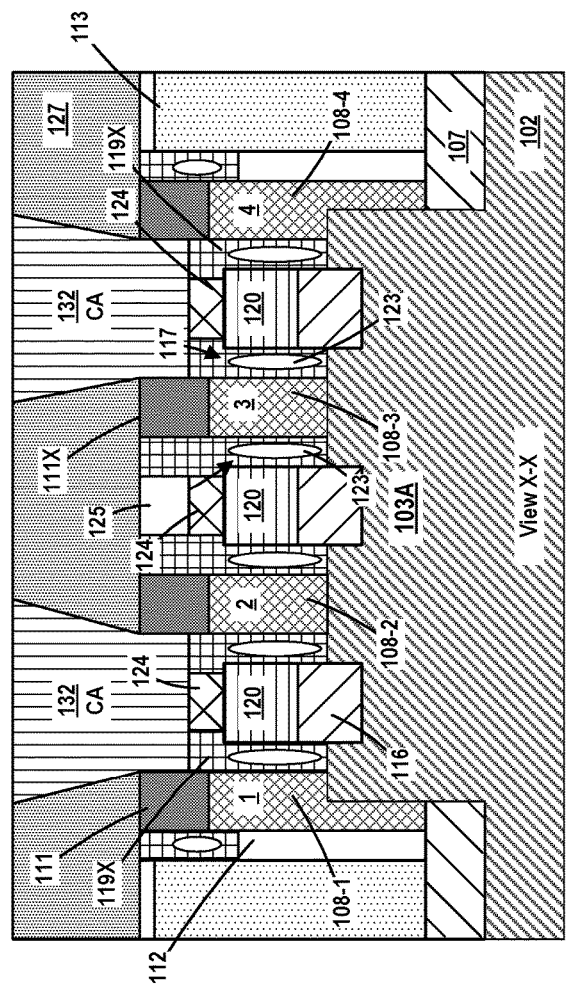

FIG. 13 depicts an alternative embodiment of the source/drain contacts 132 wherein both the insulating material 125 positioned above the conductive source/drain structures 120 and portions of the sidewall spacer 119X are removed prior to the formation of the source/drain contacts 132 in the insulating material 127.

As will be appreciated by those skilled in the art after a complete reading of the present application, various novel products and methods are disclosed herein. For example, one illustrative IC product 100 disclosed herein comprises a transistor device comprising a gate structure 108 positioned above an active region formed on a semiconducting substrate 102, first and second conductive source/drain structures 120 positioned adjacent opposite sidewalls of the gate structure 108 and insulating material, e.g., the sidewall spacer 119X, positioned laterally between the gate structure 108 and each of the first and second conductive source/drain structures 120. The conductive material 124 may also be selectively formed above the recessed conductive source/drain structures 120. In one example, the product also includes first and second air gaps 123 positioned adjacent opposite sidewalls of the gate structure 108, wherein each of the air gaps 123 is positioned in the insulating material between the gate structure 108 and at least the first and second conductive source/drain structures 120, respectively, a gate contact structure 130 that is positioned entirely above the active region and conductively coupled to the gate structure, and a source/drain contact structure 132 that is positioned entirely above the active region, wherein the source/drain contact structure 132 is conductively coupled to at least one of the first and second conductive source/drain structures 120 via the conductive material 124.

Another illustrative IC product disclosed herein comprises a transistor device comprising a gate structure 108 positioned above an active region formed on a semiconducting substrate, first and second conductive source/drain structures 120 located on opposite sides of the gate structure 120 and a sidewall spacer 119X positioned adjacent opposite sidewalls of the gate structure, wherein a first portion of the sidewall spacer 119X is positioned between the gate structure and the first conductive source/drain structure and a second portion of the sidewall spacer 119X is positioned between the gate structure 108 and the second conductive source/drain structure. In this example, the product also includes a first air gap 123 positioned in at least the first portion of the sidewall spacer 119X at a location between the gate structure 108 and the first conductive source/drain structure and a second air gap 123 positioned in at least the second portion of the sidewall spacer 119X at a location between the gate structure 108 and the second conductive source/drain structure. The product also includes a gate contact structure 130 that is positioned entirely above the active region and conductively coupled to the gate structure 108 and a source/drain contact structure 132 that is positioned entirely above the active region and conductively coupled to at least one of the first and second conductive source/drain structures.

One illustrative method disclosed herein includes forming a gate for a transistor device, the gate 106 comprising a gate structure 108, a first sidewall spacer 112 positioned adjacent the gate structure 108 and a gate cap positioned above the gate structure 108, forming first and second conductive source/drain structures 120 on opposite sides of the gate 106, the first and second conductive source/drain structures 120 having an initial vertical height, wherein a first portion of the sidewall spacer 112 is positioned between the gate structure 108 and the first conductive source/drain structure and a second portion of the sidewall spacer 112 is positioned between the gate structure and the second conductive source/drain structure. In this example, the method also includes performing a recess etching process on the first and second conductive source/drain structures 120 to form recessed first and second conductive source/drain structures having a recessed vertical height that is less than the initial vertical height, removing the first and second portions of the sidewall spacer 112 to form first and second lateral spaces 117 between the gate structure 108 and each of the first and second conductive source/drain structures 120, respectively, and forming a second sidewall spacer 119X adjacent the gate structure 108 so as to result in the formation of first and second air gaps 123, wherein the first air gap 123 is positioned in at least the first portion of the second sidewall spacer 119X at a location between the gate structure 108 and the first conductive source/drain structure and the second air gap 123 is positioned in at least the second portion of the second sidewall spacer 119X at a location between the gate structure 108 and the second conductive source/drain structure. In this example, the method also includes forming a gate contact structure 130 that is positioned entirely above the active region and conductively coupled to the gate structure 108 and forming a source/drain contact structure 132 that is positioned entirely above the active region and conductively coupled to at least one of the first and second conductive source/drain structures.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:
1. An integrated circuit product, comprising:
a transistor device comprising a gate structure positioned above an active region formed on a semiconducting substrate;
first and second conductive source/drain structures positioned adjacent opposite sidewalls of said gate structure;
insulating material positioned laterally between said gate structure and each of said first and second conductive source/drain structures;
first and second air gaps positioned adjacent opposite sidewalls of said gate structure, wherein each of said air gaps is positioned in said insulating material between said gate structure and said first and second conductive source/drain structures, respectively;

a gate contact structure that is positioned entirely above said active region and conductively coupled to said gate structure; and a source/drain contact structure that is positioned entirely above said active region, wherein said source/drain contact structure is conductively coupled to at least one of said first and second conductive source/drain structures.

2. The integrated circuit product of claim 1, further comprising a second source/drain contact structure that is positioned entirely above said active region, wherein said second source/drain contact structure is conductively coupled to at least one of said first and second conductive source/drain structures.

3. The integrated circuit product of claim 1, wherein said insulating material between said gate structure and said first and second conductive source/drain structures comprises a portion of a sidewall spacer positioned adjacent said gate structure.

4. The integrated circuit product of claim 1, further comprising a conductive material positioned above said first and second conductive source/drain structures, wherein said source/drain contact structure contacts said conductive material.

5. The integrated circuit product of claim 4, wherein an uppermost part of said first and second air gaps is positioned at a level that is below a level of an upper surface of said first and second conductive source/drain structures.

6. The integrated circuit product of claim 1, further comprising an insulating source/drain cap structure positioned above each of said first and second conductive source/drain structures.

7. The integrated circuit product of claim 1, wherein said first and second air gaps constitute a substantially continuous air gap that extends around an entire perimeter of said gate structure.

8. The integrated circuit product of claim 1, wherein said first and second air gaps are positioned only above said active region.

9. The integrated circuit product of claim 1, wherein portions of said gate contact structure are positioned vertically above said first and second air gaps.

10. The integrated circuit product of claim 1, wherein a portion of said source/drain contact structure is positioned vertically above one of said first and second air gaps.

11. The integrated circuit product of claim 1, wherein each of said first and second conductive source/drain structures has an upper surface that is positioned at a level that is below a level of an upper surface of said gate structure.

12. The integrated circuit product of claim 1, wherein each of said first and second conductive source/drain structures comprises a metal silicide material and each of said first and second conductive source/drain structures have an axial length in a gate width direction of said transistor device that is at least equal to an dimension of said active region in said gate width direction of said transistor device.

13. An integrated circuit product, comprising:
a transistor device comprising a gate structure positioned above an active region formed on a semiconducting substrate;
first and second conductive source/drain structures located on opposite sides of said gate structure;
a sidewall spacer positioned adjacent opposite sidewalls of said gate structure, wherein a first portion of said sidewall spacer is positioned between said gate structure and said first conductive source/drain structure and a second portion of said sidewall spacer is positioned between said gate structure and said second conductive source/drain structure;
a first air gap positioned in at least said first portion of said sidewall spacer at a location between said gate structure and said first conductive source/drain structure;
a second air gap positioned in at least said second portion of said sidewall spacer at a location between said gate structure and said second conductive source/drain structure;
a gate contact structure that is positioned entirely above said active region and conductively coupled to said gate structure; and
a source/drain contact structure that is positioned entirely above said active region, wherein said source/drain contact structure is conductively coupled to at least one of said first and second conductive source/drain structures.

14. The integrated circuit product of claim 13, further comprising a second source/drain contact structure that is positioned entirely above said active region, wherein said second source/drain contact structure is conductively coupled to at least one of said first and second conductive source/drain structures.

15. The integrated circuit product of claim 13, further comprising an insulating source/drain cap structure positioned above each of said first and second conductive source/drain structures.

16. The integrated circuit product of claim 13, wherein said first and second air gaps constitute a substantially continuous air gap that extends around an entire perimeter of said gate structure.

17. The integrated circuit product of claim 13, wherein said first and second air gaps are positioned only above said active region.

18. The integrated circuit product of claim 13, wherein each of said first and second conductive source/drain structures has an upper surface that is positioned at a level that is below a level of an upper surface of said gate structure.

* * * * *